US009356855B2

(12) United States Patent
Gintis (10) Patent No.: US 9,356,855 B2
(45) Date of Patent: May 31, 2016

(54) METHODS, SYSTEMS, AND COMPUTER READABLE MEDIA FOR PROVIDING FOR SPECIFICATION OR AUTODISCOVERY OF DEVICE UNDER TEST (DUT) TOPOLOGY INFORMATION

(71) Applicant: Ixia, Calabasas, CA (US)

(72) Inventor: Noah Gintis, Westlake Village, CA (US)

(73) Assignee: Ixia, Calabasas, CA (US)

( * ) Notice: Subject to any disclaimer, the term of this patent is extended or adjusted under 35 U.S.C. 154(b) by 69 days.

(21) Appl. No.: 14/051,424

(22) Filed: Oct. 10, 2013

(65) Prior Publication Data

US 2015/0106669 A1    Apr. 16, 2015

(51) Int. Cl.
| | |
|---|---|
| *H04L 12/26* | (2006.01) |
| *H04L 12/24* | (2006.01) |
| *H04L 12/701* | (2013.01) |
| *H04L 12/751* | (2013.01) |
| *G01R 31/3181* | (2006.01) |
| *G06F 11/22* | (2006.01) |

(Continued)

(52) U.S. Cl.
CPC ............ *H04L 43/50* (2013.01); *G01R 31/3177* (2013.01); *G01R 31/31813* (2013.01); *G01R 31/31855* (2013.01); *G01R 31/31926* (2013.01); *G01R 31/318538* (2013.01); *G01R 31/318544* (2013.01); *G01R 31/3272* (2013.01); *G06F 11/2294* (2013.01); *G11C 29/56* (2013.01); *H04L 41/0866* (2013.01); *H04L 41/12* (2013.01); *H04L 41/22* (2013.01); *H04L 45/00* (2013.01); *H04L 45/02* (2013.01)

(58) Field of Classification Search
CPC ......... H04L 43/50; H04L 41/12; H04L 45/00; H04L 45/02; H04L 41/0866; H04L 41/22; G06F 11/2294; G01R 31/31926; G01R 31/3177; G01R 31/31813; G01R 31/318538; G01R 31/318544; G01R 31/31855; G01R 31/3272; G11C 29/56; H04Q 11/0062; H04W 24/00
USPC ................. 714/738, 742, 720, 724, 726, 727; 709/224; 324/415; 370/254; 455/423, 455/67.11; 702/117
See application file for complete search history.

(56) References Cited

U.S. PATENT DOCUMENTS 5,263,029 A * 11/1993 Wicklund, Jr. ................ 714/718
5,757,820 A * 5/1998 Angelotti ...................... 714/738

(Continued)

OTHER PUBLICATIONS

Poretsky et al., Benchmarking Methodology for Link-State IGP Data Plane Route Convergence, May 10, 2010, Network Working Group, pp. 1-28.*

(Continued)

*Primary Examiner* — John J Tabone, Jr.
(74) *Attorney, Agent, or Firm* — Jenkins, Wilson, Taylor & Hunt, P.A.

(57) ABSTRACT

The subject matter described herein includes methods, systems, and computer readable media for providing for specification or autodiscovery of DUT topology information and for using the DUT topology information to generate DUT-topology-specific test results. One exemplary method includes, providing for specification or autodiscovery of DUT topology information associated with or more devices under test (DUT). The method further includes transmitting test packets to the at least one DUT. The method further includes receiving packets transmitted from or through the at least one DUT. The method further includes using the DUT topology information and the received packets to generate DUT-topology-specific test results.

24 Claims, 5 Drawing Sheets

(51) Int. Cl.
   *G01R 31/319* (2006.01)
   *G01R 31/3177* (2006.01)
   *G11C 29/56* (2006.01)
   *G01R 31/327* (2006.01)
   *G01R 31/3185* (2006.01)

(56) References Cited

U.S. PATENT DOCUMENTS

| | | | | |
|---|---|---|---|---|
| 6,122,753 | A * | 9/2000 | Masuo et al. | 714/4.2 |
| 6,321,356 | B1 * | 11/2001 | Snodgrass et al. | 714/738 |
| 6,513,138 | B1 * | 1/2003 | Ohsawa | 714/738 |
| 7,154,860 | B1 * | 12/2006 | Nanba | 370/254 |
| 7,221,912 | B2 * | 5/2007 | Nelson et al. | 455/67.11 |
| 7,272,765 | B2 * | 9/2007 | Ichiyoshi | 714/742 |
| 7,370,236 | B2 * | 5/2008 | Szucs et al. | 714/25 |
| 7,590,903 | B2 * | 9/2009 | Volkerink et al. | 714/725 |
| 8,086,660 | B2 * | 12/2011 | Smith | 709/201 |
| 8,255,749 | B2 * | 8/2012 | Swoboda | 714/726 |
| 8,826,088 | B2 * | 9/2014 | Swoboda | 714/726 |
| 2002/0093961 | A1 * | 7/2002 | Sharma et al. | 370/392 |
| 2003/0043745 | A1 * | 3/2003 | Kano et al. | 370/238 |
| 2003/0140279 | A1 * | 7/2003 | Szucs et al. | 714/31 |
| 2006/0159033 | A1 * | 7/2006 | Suzuki et al. | 370/254 |
| 2006/0268944 | A1 * | 11/2006 | Xu | 370/903 |
| 2007/0291650 | A1 * | 12/2007 | Ormazabal | 370/244 |
| 2008/0162994 | A1 * | 7/2008 | Szucs et al. | 714/25 |
| 2008/0198768 | A1 * | 8/2008 | Nanjundaswamy et al. | 370/255 |
| 2009/0222694 | A1 * | 9/2009 | Adir et al. | 714/26 |
| 2009/0303880 | A1 * | 12/2009 | Maltz | H04L 45/02 370/235 |
| 2010/0058457 | A1 * | 3/2010 | Ormazabal | 726/11 |
| 2010/0110883 | A1 * | 5/2010 | Russell et al. | 370/228 |
| 2010/0204948 | A1 * | 8/2010 | Kirrmann et al. | 702/117 |
| 2011/0305168 | A1 * | 12/2011 | Koide | H04L 41/12 370/255 |
| 2013/0173940 | A1 * | 7/2013 | Sargent et al. | 713/310 |
| 2013/0311646 | A1 * | 11/2013 | Nikaido et al. | 709/224 |
| 2014/0098824 | A1 * | 4/2014 | Edmiston | 370/412 |
| 2014/0115421 | A1 * | 4/2014 | Cai | 714/758 |
| 2014/0269386 | A1 * | 9/2014 | Chu et al. | 370/252 |
| 2014/0269390 | A1 * | 9/2014 | Ciodaru et al. | 370/252 |
| 2015/0003259 | A1 * | 1/2015 | Gao | H04L 45/18 370/244 |
| 2015/0106670 | A1 | 4/2015 | Gintis | |

OTHER PUBLICATIONS

Han et al., Star Topology Test Architecture for Multi-site Testing, Jun. 27, 2012 , IEEE, pp. 1-5.*
Commonly-assigned, co-pending U.S. Appl. No. 14/452,205 for "Methods, Systems, and Computer Readable Media for Providing User Interfaces for Specification of System Under Test (SUT) and Network Tap Topology and for Presenting Topology Specific Test Results," (Unpublished, filed Aug. 5, 2014).

* cited by examiner

| FLOW | DUT1 | DUT2 | DUT3 | DUT4 | DUT5 | DUT6 | DUT7 | B-TO-B | FULL PATH |
|---|---|---|---|---|---|---|---|---|---|
| A-X | 50/50 | 49/50 | 47/50 | 2/0 | 47/50 | 0/0 | 0/0 | 0/0 | 49/50 |
| B-Y | 0/0 | 0/0 | 0/0 | 0/0 | 0/0 | 50/50 | 49/50 | 0/0 | 48/50 |
| C-Z | 0/0 | 0/0 | 0/0 | 0/0 | 0/0 | 0/0 | 0/0 | 50/50 | 50/50 |

METHODS, SYSTEMS, AND COMPUTER READABLE MEDIA FOR PROVIDING FOR SPECIFICATION OR AUTODISCOVERY OF DEVICE UNDER TEST (DUT) TOPOLOGY INFORMATION

TECHNICAL FIELD

The subject matter described herein relates to testing network equipment. More particularly, the subject matter described herein relates to methods, systems, and computer readable media for providing for specification or autodiscovery of DUT topology information.

BACKGROUND

In network lab testing environments, network equipment test devices are connected to single or multiple devices under test (DUTs). The network equipment test devices send packets to the DUTs, receive packet from the DUTs, and generate statistics based on the received packets.

Currently, network equipment test devices allow topology information to be specified about the network equipment test devices themselves. However, DUTs are treated as a black box by current network equipment test devices. That is, current network equipment test devices do not allow the specification of topology information associated with DUTs. Accordingly, the test administrator is required to manually interpret received packets statistics to identify configuration errors associated with DUTs. In light of the voluminous nature of network test data, such manual interpretation is undesirable.

Accordingly, there exists a need for methods, systems, and computer readable media for providing for specification or autodiscovery of DUT topology information.

SUMMARY

The subject matter described herein includes methods, systems, and computer readable media for providing for specification or autodiscovery of DUT topology information and for using the DUT topology information to generate DUT-topology-specific test results. One exemplary method includes providing for specification or autodiscovery of DUT topology information associated with or more devices under test (DUT). The method further includes transmitting test packets to the at least one DUT. The method further includes receiving packets transmitted from or through the at least one DUT. The method further includes using the DUT topology information and the received packets to generate DUT-topology-specific test results. In one example, the DUT-topology-specific test results are displayed to the user. According to another aspect, DUT-topology-specific test results may be used to reconfigure test cases or generate new test cases for testing one or more devices under test.

The subject matter described herein can be implemented in software in combination with hardware and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

The subject matter described herein will now be explained with reference to the accompanying drawings of which.

DETAILED DESCRIPTION

Figure 1:
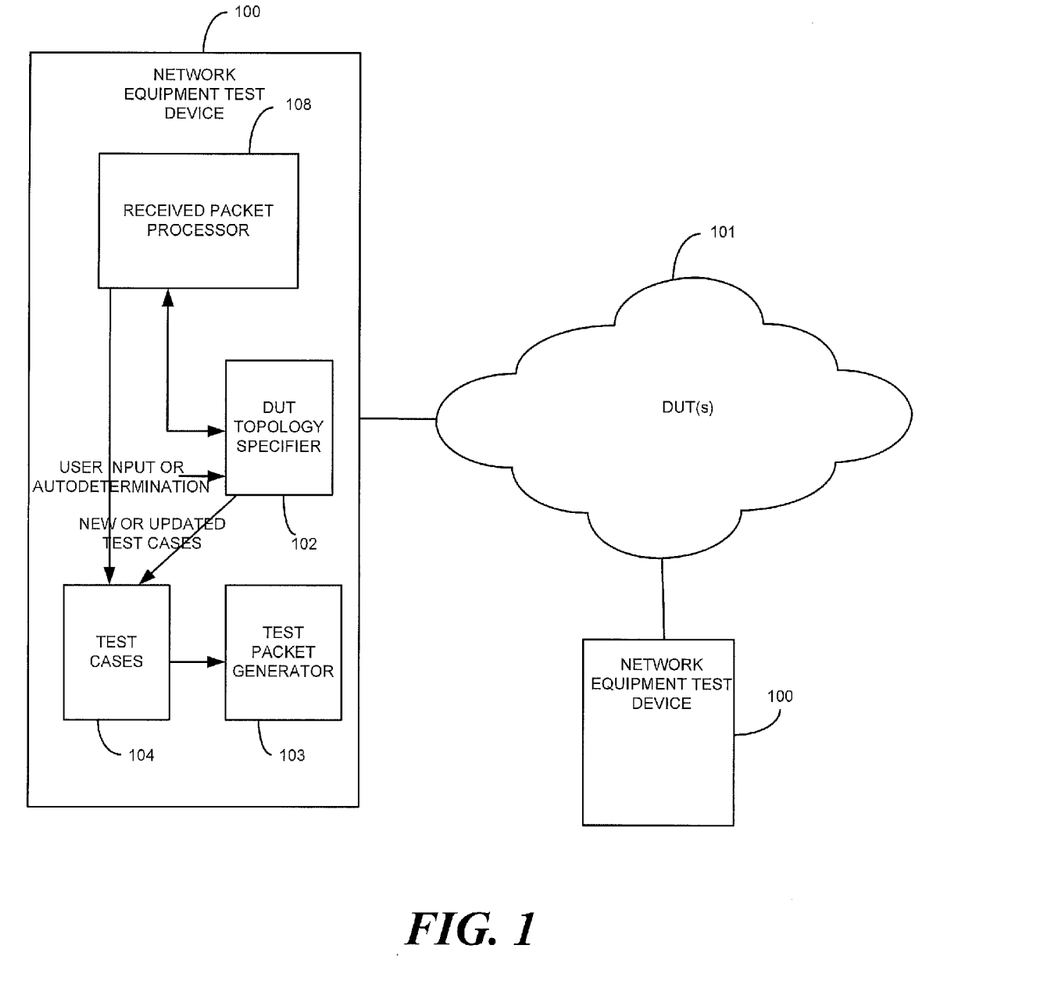
FIG. 1 is a block diagram illustrating a lab test environment where two network equipment test devices are configured to test one or more DUTs according to an embodiment of the subject matter described herein.

The subject matter described herein relates to methods, systems, and computer readable media for specifying and utilizing DUT topology information. FIG. 1 is a block diagram illustrating an exemplary lab test environment where network equipment test devices are configured to test one or more DUTs. Referring to FIG. 1, network equipment test devices 100 may be configured as source and destination, respectively, to test one or more DUTs 101. In the illustrated example, DUTs 101 appear as a cloud, which is the way that DUTs are currently visualized on the graphical user interfaces of network equipment test devices 100. Because topology information associated with DUTs 101 may be important in visualizing test results, analyzing test results, and configuring subsequent tests, each network equipment test device 100 may include a DUT topology specifier 102 that allows the user to specify DUT topology information and/or automatically discovers DUT topology information. For example, a user may input data regarding the configuration of DUTs 101. DUT topology specifier 102 may store this information. In an alternate implementation, DUT topology specifier 102 may automatically discover DUT topology information, for example, by sending topology discovery packets, such as packet Internet groper (PING), address resolution protocol (ARP), or simple network management protocol (SNMP) packets to DUTs 101 to determine topology information associated with DUTs 101. In yet another alternate implementation, DUT topology specifier 102 may receive user input regarding DUT topology, use autodiscovery to determine the actual topology, compare the actual topology to the user input topology, and report results of the comparison to the user. For example, DUT topology specifier 102 may report graphically any differences between the user input topology and the autodiscovered topology.

Once DUT topology information has been specified, either through user input or autodiscovery and the user starts a test, a test packet generator 103 generates and sends test packets to DUTs 101 based on test cases 104. Because DUT topology information has been specified, when packets are received by received packet processor 108, the topology information can be used to generate DUT-topology-specific test results from the received packets. Examples of DUT-topology-specific test results include DUT coverage by a test, link coverage by a test, and packet statistics on a per link and/or per DUT basis. The DUT-topology-specific test results may also be used to generate new test cases and/or reconfigure existing test cases. For example, if a test indicates that a particular DUT in the DUT topology fails to forward packets, additional test cases may be created for this DUT.

Figure 2:
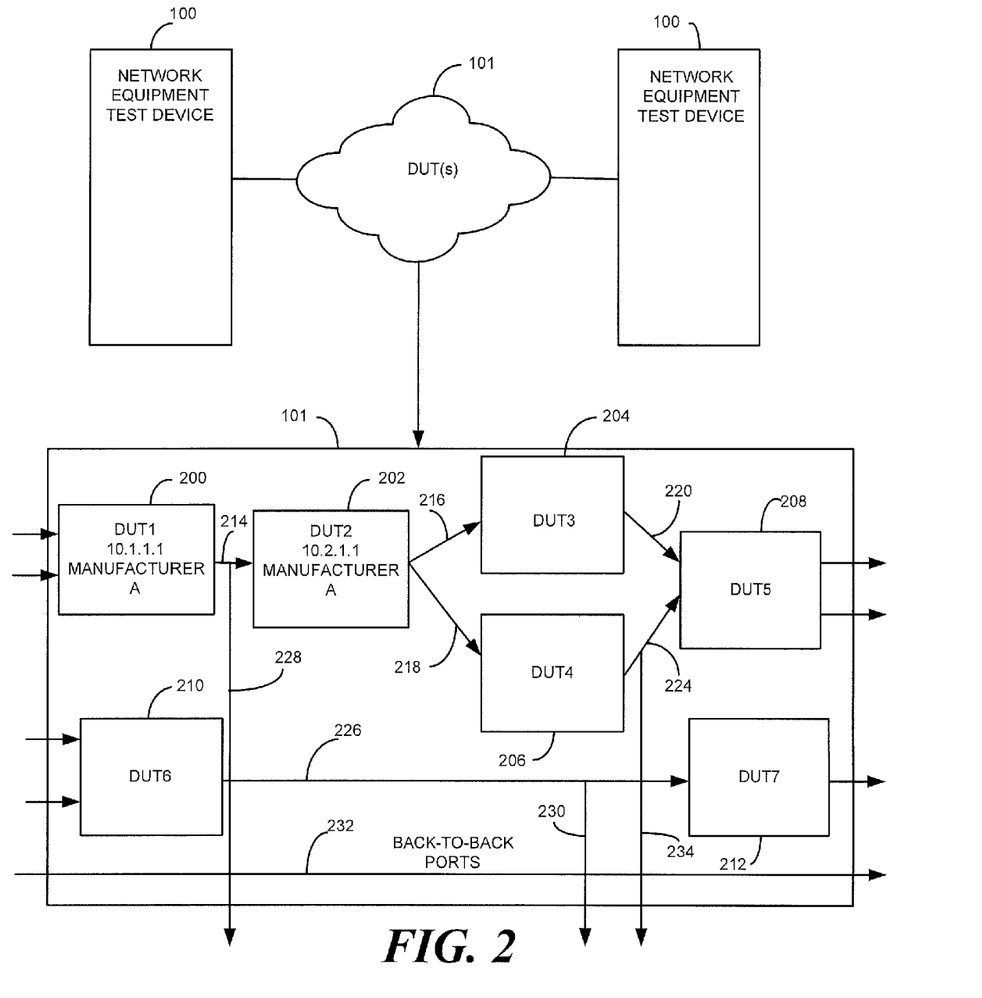
FIG. 2 is a block diagram illustrating exemplary specification of DUT topology information that may be performed by one or both of the network equipment test devices in FIG. 1.

FIG. 2 is an example of DUT topology information that may be specified for the cloud illustrated in FIG. 1. Referring to FIG. 2, DUT cloud 101 may be editable by the user via a graphical user interface provided by DUT topology specifier 102. Thus, FIG. 2 is an example of a graphical user interface that DUT topology specifier 102 may present to the user. DUT cloud 101 may be a selectable and editable graphical user interface element. When the user selects DUT cloud 101, DUT topology specifier 102 may allow the user to define DUTs and interconnections between DUTs. In the illustrated example, the use has defined devices under test 200, 202, 204, 206, 208, 210, and 212. The user is also enabled to input interconnections 214, 216, 218, 220, 224, and 226 between the DUTs. The user is further enabled to specify the location of tap points 228, 230, and 234 that represent packet capture points between the DUTs. The user is further enabled to specify back to back ports 232, which are ports of network equipment test devices 100 that are connected to each other. Back to back ports may be used to verify the functionality of network equipment test devices 100. The user is further enabled to specify names associated with each device under test, i.e., "DUT1". The user is further enabled to specify IP address information and manufacturers associated with the DUTs. In the illustrated example, the user has defined two of the DUTs as Manufacturer A DUTs and has specified IP addresses for the Manufacturer A DUTs.

As described above, once DUT topology information is specified, the DUT topology information can be used to visualize and/or analyze test results. For example, test packet generator 103 may transmit test packets to a device under test. Received packet processor 108 may receive packets from the device under test and determine, using the stored topology information, which links between the devices under test were covered by the test. Received packet processor 108 may generate a diagram, similar to that illustrated in FIG. 2 that shows visually, which links were traversed by the test packets. Received packet processor 108 may highlight any links or DUTs that are not traversed in a test for subsequent testing.

Figure 3A:
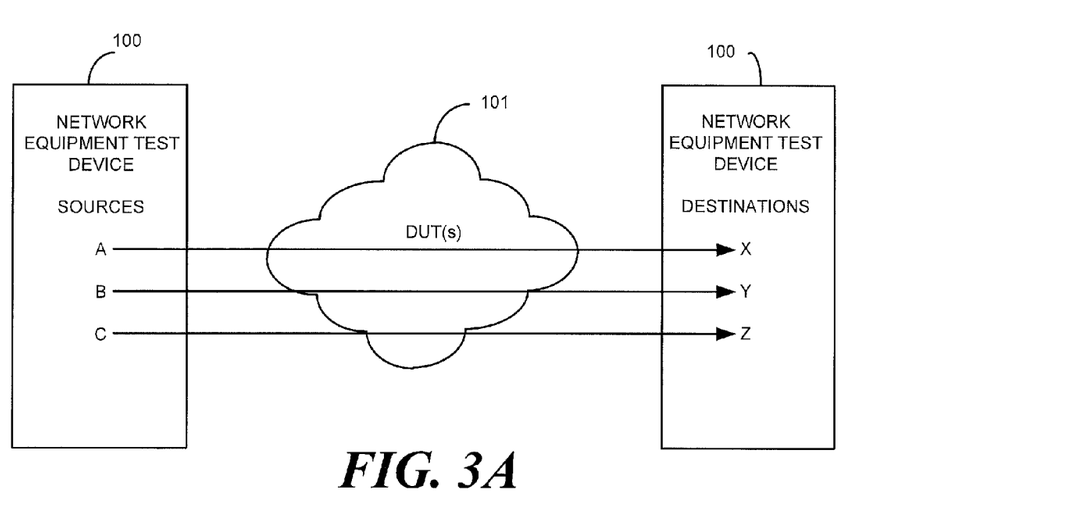
FIG. 3A is a block diagram illustrating exemplary specification of source and destination information by a network equipment test device.
Figure 3B:
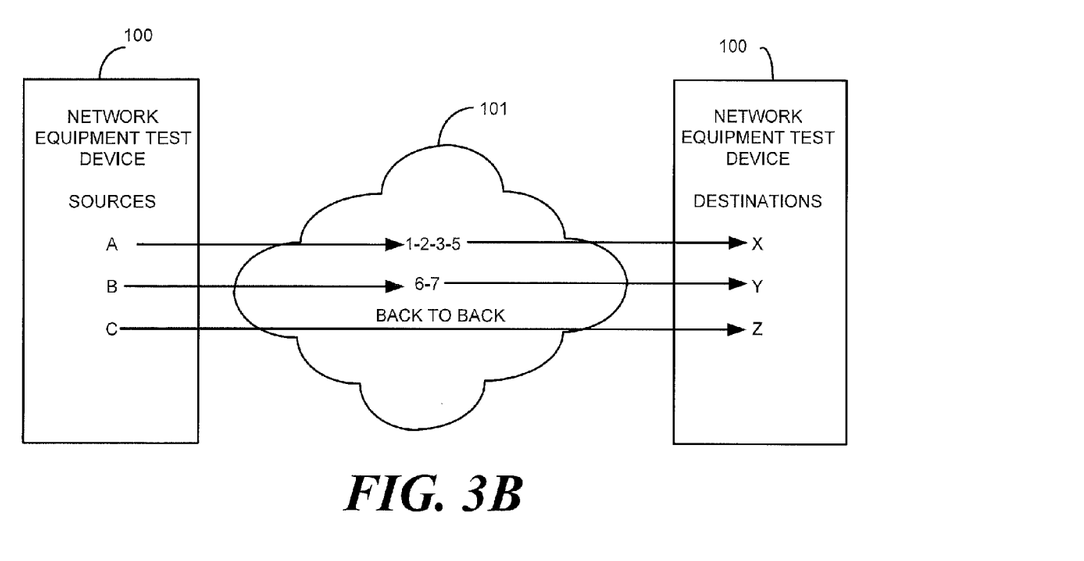
FIG. 3B is block diagram illustrating specification of a path through DUTs using DUT topology information according to an embodiment of the subject matter described herein.

In another example, as illustrated in FIGS. 3A and 3B, DUT topology specifier 102 may provide for user specification of the path through a network of devices under test through which packets will travel during a test and may store the associated test case in memory of network equipment test device 100. For example, FIG. 3A illustrates the conventional specification of packet destinations without specifying a path through the devices under test. However, once device under test topology information is known, the test administrator can specify, using the device under test topology information, a path through the devices under test. In FIG. 3B, packets from source A to destination X will pass through devices under test 1-5. Packets from source B to destination Y will traverse devices under test 6 and 7. Packets from source C to destination Z will be transmitted over a back to back connection.

DUT topology specifier 102 may provide a test case edit mode where the user graphically defines the paths of packets through a network of devices under test, using an interface similar to that illustrated in FIG. 3B. Once the user defines the paths through the devices under test, DUT topology specifier 102 may create and store the corresponding test case for later execution by network equipment test device 100.

Figure 4:
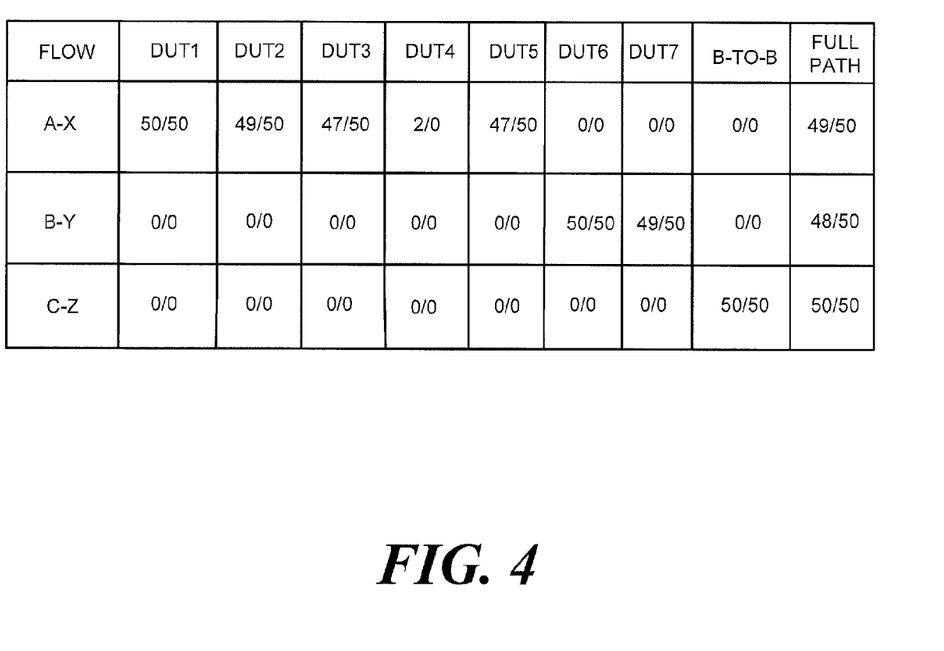
FIG. 4 is a table illustrating exemplary DUT-topology-specific test results that may be generated by a network equipment test device according to an embodiment of the subject matter described herein.

As stated above, received packet processor 108 may utilize the DUT topology information to generate DUT-topology-specific test results. FIG. 4 is a table illustrating an example of DUT-topology-specific test results that may be generated by received packet processor 108 using the DUT topology information. Referring to FIG. 4, the table indicates that for a flow from source A to destination X, the number of packets received and the number of packets expected at different points in the device under test topology. For example at DUT 1, 50 packets were received and 50 packets were expected. For the same flow, at DUT 2, 49 packets were received and 50 were expected, indicating that one packet was lost before DUT 2. At DUT 3, 47 packets were received and 50 were expected, indicating a loss of 3 packets before DUT 3. At DUT 4, two packets were expected and zero packets were received, indicating a loss of two packets before DUT 4. For the full path, 49 packets were received and 50 were transmitted, indicating one packet lost for the entire test. For the A-X packet flow, it can be seen from the table illustrated in FIG. 4 that only one packet did not make it completely through the test. However, the topology information allows the user to determine that a certain number of packets did not proceed along their expected paths through the network of devices under test.

Returning to FIG. 3B, for the B-Y flow, packets are only expected to traverse DUTs 6 and 7. In the topology illustrated in in FIG. 2, the path from the source network equipment test device 100 to the destination network equipment test device 100 through DUTs 6 and 7 does not traverse any other DUTs. Thus, in FIG. 4, for the B-Y flow, the expected packets at DUTs 1-5 are all zero, as all of the packets should traverse DUTs 6 and 7 only. Similarly, for the C-Z flow, the packets are expected to only traverse the back to back connection between network equipment test devices 100, the expected packets at each DUT are zero in the table illustrated in FIG. 4. The actual number of packets that traverse the back to back connection is equal to the expected number of packets, indicating that the back to back connection works correctly for the particular flow used in the test.

In another example of DUT-topology-specific test results, received packet processor 108 may generate latency graphs as a function of location in the DUT topology. For example, a latency graph may be generated showing the average latency on each link 214, 216, 218, 220, 224, and 226 illustrated in FIG. 2.

As stated above, the DUT-topology-specific test results may be used to generate new test cases or update existing test cases. Such generation may be performed dynamically by received packet processor 108 during a test or statically by a test administrator using the interface provided by DUT topology specifier 102 after viewing DUT-topology-specific test results. In the automated case, received packet processor 108 may determine that a particular test is not covering all of the DUTs in the topology and may modify the test during execution of the test to send packets to the DUT that was initially not covered by the test. Such a modification may also be performed manually by the test administrator after viewing test results. In another example, if the test results indicate that a particular device under test is causing packet loss for packets over a certain size, received packet processor 108 may reduce the packet size of packets sent to the DUT until the packets pass the DUT.

In another example, if the DUT-topology-specific test results indicate that all packets are being transmitted over one link but no packets are being transmitted over another link through which packets are expected to be transmitted, it may be desirable to review the cabling between the network equipment test devices and the devices under test to determine whether a cable misconfiguration has occurred before running subsequent tests.

Figure 5:
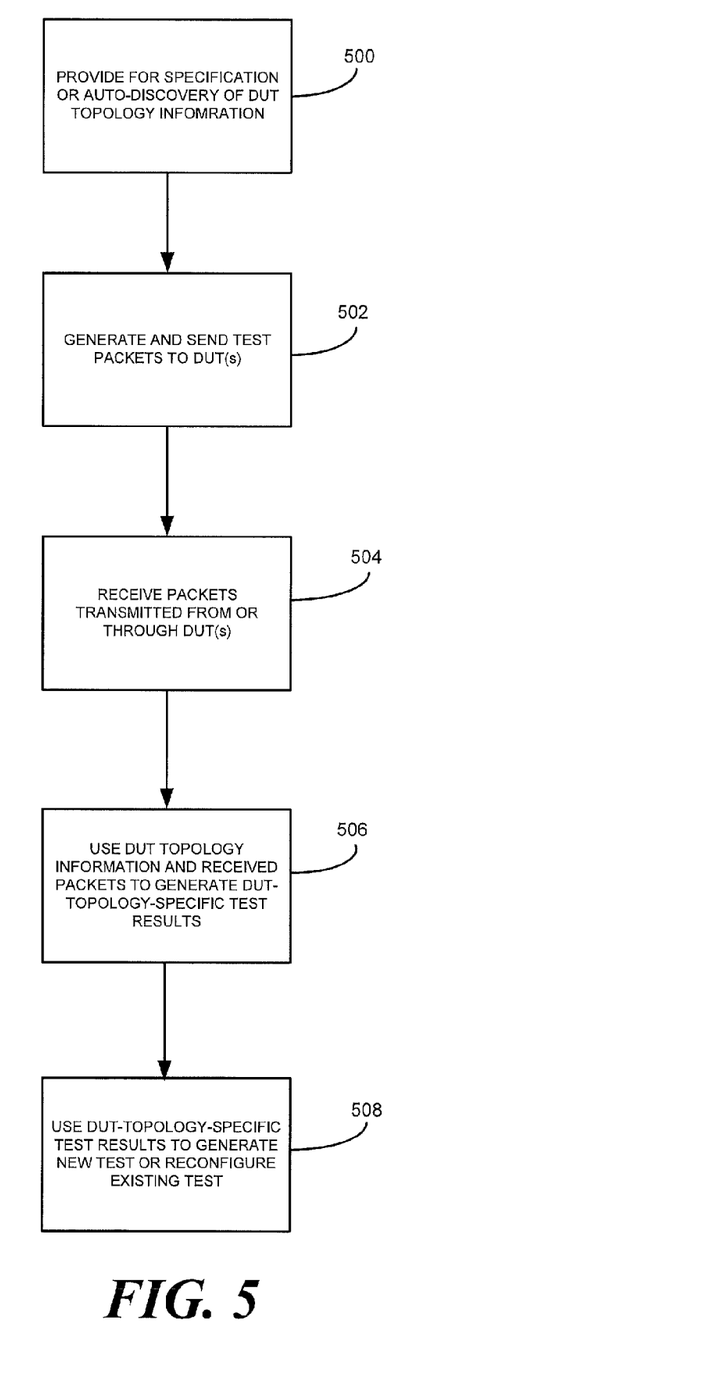
FIG. 5 is a flow chart illustrating an exemplary process for specifying or autodiscovering and utilizing DUT topology information according to an embodiment of the subject matter described herein.

FIG. 5 is a flow chart illustrating exemplary overall steps for specifying and utilizing device under test topology information according to an embodiment of the subject matter described herein. Referring to FIG. 5, in step 500, the method includes providing for the specification or autodiscovery of DUT topology information. As stated above, providing for the specification of DUT topology information may include allowing the user to input DUT topology information via a graphical user interface, similar to that illustrated in FIG. 2. Automatically discovering device under test topology information may include generating and sending topology discovery messages, such as ARP, SNMP, or PING messages, to the DUTs. In step 502, test packets are transmitted to the device under test. The test packets may be part of a device under test link coverage test, an MTU size test, or any suitable test. Because DUT topology information is known, transmitting the test packets may include specifying, on a per packet flow basis, a path through the DUTS, as illustrated in FIG. 3B.

In step 504, packets are received from the device under test. The packets may be packets that were transmitted by or through the devices under test. In step 506, the method includes generating DUT-topology-specific information from the test results. An example of such information is illustrated in FIG. 4. In step 508, the DUT-topology-specific test results are used to reconfigure a test or to generate a new test. For example, if the test results indicate lack of coverage on a particular inter-DUT link, a subsequent test may be structured to test that link. In another example, if packet loss is occurring at a particular device under test, additional testing directed to that device under test may be generated.

Although in the examples above, packets are described as being received from the DUTs, it is understood that packets transmitted from or through the DUTs could be collected by network taps, such as the network taps illustrated in FIG. 2, and provided by the taps to the network equipment test device or to memory accessible to the network equipment test device. In one embodiment, the network taps may be one or more network tool optimizer devices with at least one network port that receives packets transmitted from or through the devices under test and at least one tool port that forwards the packets to the network equipment test device. In addition, although the DUT topology specifier is shown as being a component of the network equipment test device, it is understood that the OUT topology specifier may reside in whole or in part on an administrative terminal that has access to the network equipment test device to configure its test cases and/or interpret test results.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method for specifying and utilizing device under test (DUT) topology information, the method comprising:
at one or more network equipment test devices:
providing for specification or autodiscovery of DUT topology information specifying a plurality of DUTs and interconnections between the DUTs in a data communications network;
generating and transmitting test packets from a first transmit port of the one or more network equipment test devices destined to a receive port of the one or more network equipment test devices by way of at least one DUT of the plurality of DUTs, which route the test packets according to a network protocol for the data communications network;
receiving, at the receive port of the one or more network equipment test devices, result packets transmitted from or through the at least one DUT of the plurality of DUTs in response to the test packets; and
using the DUT topology information and the result packets to generate DUT-topology-specific test results.

2. The method of claim 1 wherein providing for specification or autodiscovery of DUT topology information includes providing a graphical user interface that allows a test administrator to graphically define DUTs and interconnections between the DUTs.

3. The method of claim 1 wherein providing for specification or autodiscovery of DUT topology information includes providing for user specification of network tap points between DUTs.

4. The method of claim 1 wherein providing for specification or autodiscovery of DUT topology information includes transmitting topology discovery messages to the at least one DUT, wherein the topology discovery messages include one or more of: packet Internet groper (PING) packets, address resolution protocol (ARP) packets, or simple network management protocol (SNMP) packets.

5. The method of claim 1 comprising providing for specification of a path through the at least one DUT for the test packets and wherein generating and transmitting the test packets includes transmitting the test packets over the specified path through the at least one DUT.

6. The method of claim 1 wherein generating DUT-topology-specific test results includes generating an indication of DUT coverage by the test packets.

7. The method of claim 1 wherein generating DUT-topology-specific test results includes generating per-DUT packet statistics for at least the at least one DUT.

8. The method of claim 7 wherein the per-DUT packet statistics include received and expected packets at the at least one DUT.

9. The method of claim 7 wherein the per-DUT packet statistics include per-DUT latency statistics.

10. The method of claim 1 comprising utilizing the DUT-topology-specific test results to generate new test cases or reconfigure existing test cases.

11. The method of claim 1 wherein the providing, generating, receiving, and using are performed in a laboratory test environment.

12. The method of claim 1 wherein receiving result packets transmitted from or through the at least one DUT includes receiving the result packets from at least one network tap that feeds the packets to the network equipment test device.

13. A system for specifying and utilizing device under test (DUT) topology information, the system comprising:
at one or more network equipment test devices:
a DUT topology specifier configured to provide for specification or autodiscovery of DUT topology information specifying a plurality of DUTs and interconnections between the DUTs in a data communications network;

a test packet generator configured to generate and transmit test packets from a first transmit port of the one or more network equipment test devices destined to a receive port of the one or more network equipment test devices by way of at least one DUT of the plurality of DUTs, which route the test packets according to a network protocol for the data communications network; and a received packet processor configured to receive, at the receive port of the one or more network equipment test devices, result packets transmitted from or through the at least one DUT of the plurality of DUTs in response to the test packets and to use the DUT topology information and the result packets to generate DUT-topology-specific test results.

14. The system of claim 13 wherein the DUT topology specifier is configured to provide a graphical user interface that allows a test administrator to graphically specify DUTs and interconnections between the DUTs.

15. The system of claim 13 wherein the DUT topology specifier is configured to provide for user specification of network tap points between DUTs.

16. The system of claim 13 wherein DUT topology specifier is configured to transmit topology discovery messages to at least one DUT, wherein the topology discovery messages include one or more of: packet Internet groper (PING) packets, address resolution protocol (ARP) packets, or simple network management protocol (SNMP) packets.

17. The system of claim 13 wherein the DUT topology specifier is configured to provide for user specification of a path through the at least one DUT for the test packets and wherein the test packet generator is configured to transmit packets through the at least one DUT.

18. The system of claim 13 wherein the received packet processor is configured to generate an indication of DUT coverage by the test packets.

19. The system of claim 13 wherein the received packet processor is configured to generate per-DUT packet statistics.

20. The system of claim 19 wherein the per-DUT packet statistics include received and expected packets at each DUT.

21. The system of claim 19 wherein the per-DUT packet statistics include per-DUT latency statistics.

22. The system of claim 13 wherein the received packet processor or the DUT topology specifier is configured to utilize the DUT-topology-specific test results to generate new test cases or reconfigure existing test cases.

23. The system of claim 13 comprising at least one network tap, wherein the received packet processor is configured to receive the result packets transmitted from or through the at least one DUT from the at least one network tap.

24. A non-transitory computer readable medium having stored thereon executable instructions that when executed by one or more network equipment test devices control the one or more network equipment test devices to perform steps comprising:

providing for specification or autodiscovery of DUT topology information specifying a plurality of DUTs and interconnections between the DUTs in a data communications network;

generating and transmitting test packets from a first transmit port of the one or more network equipment test devices destined to a receive port of the one or more network equipment test devices by way of at least one DUT of the plurality of DUTs, which route the test packets according to a network protocol for the data communications network;

receiving, at the receive port of the one or more network equipment test devices, result packets transmitted from or through the at least one DUT of the plurality of DUTs in response to the test packets; and using the DUT topology information and the result packets to generate DUT-topology-specific test results.

* * * * *